(12) United States Patent
Kitaguchi et al.

(10) Patent No.: US 6,797,920 B2
(45) Date of Patent: Sep. 28, 2004

(54) MATERIAL FOR ORGANIC ELECTROLUMINESCENT DEVICE AND ITS MANUFACTURING METHOD

(75) Inventors: Toru Kitaguchi, Yokohama (JP); Shigeki Kambara, Himeji (JP)

(73) Assignee: Daicel Chemical Industries, Ltd., Osaka (JP)

(*) Notice: Subject to any disclaimer, the term of this patent is extended or adjusted under 35 U.S.C. 154(b) by 140 days.

(21) Appl. No.: 10/203,476

(22) PCT Filed: Dec. 14, 2001

(86) PCT No.: PCT/JP01/10966

§ 371 (c)(1),
(2), (4) Date: Aug. 12, 2002

(87) PCT Pub. No.: WO02/51212

PCT Pub. Date: Jun. 27, 2002

(65) Prior Publication Data

US 2003/0075533 A1 Apr. 24, 2003

(30) Foreign Application Priority Data

Dec. 20, 2000 (JP) .......................... 2000-387823
Mar. 12, 2001 (JP) .......................... 2001-68611

(51) Int. Cl.$^7$ .................. H05B 33/10; H05B 33/14; C09K 11/06
(52) U.S. Cl. .................. 219/121.85; 428/690
(58) Field of Search .......................... 219/121.6, 121.78, 219/121.79, 121.8, 121.81, 121.85; 428/690

(56) References Cited

U.S. PATENT DOCUMENTS 6,399,226 B1 * 6/2002 Kitaguchi et al. .......... 428/690
6,566,156 B1 * 5/2003 Sturm et al. ................. 438/35

FOREIGN PATENT DOCUMENTS

| JP | 59-123193 A | 7/1984 |
| JP | 6-297457 A | 10/1994 |
| JP | 9-96959 A | 4/1996 |
| JP | 8-106006 A | 4/1996 |
| JP | 9-63770 A | 3/1997 |
| JP | 11-260549 A | 9/1999 |
| JP | 2000-256487 A | 9/1999 |
| JP | 11-302393 A | 11/1999 |
| JP | 2000-150158 A | 5/2000 |
| JP | 2001-167879 A | 6/2001 |
| JP | 2000-33263 A | 2/2002 |

OTHER PUBLICATIONS

Hebner et al., Applied Physics Letters, vol. 72, No. 5, pp. 519–521 (1998).

* cited by examiner

Primary Examiner—Samuel M. Heinrich
(74) Attorney, Agent, or Firm—Birch, Stewart, Kolasch & Birch, LLP

(57) ABSTRACT

A process for producing for a material for an organic electroluminescent device having an emission center comprises irradiating a laser beam to implant an emission center-forming compound 3 constituting a source 1 into a target 2 having at least one function selected from an electron-transporting function and a hole-transporting function. According to the process, the laser beam and at least the target are relatively moved with irradiating the beam to form the emission center with a predetermined pattern. Moreover, the source and the target being in contact with each other may be moved relative to the laser beam for forming the emission center with a predetermined pattern. Further, the emission center at an area, corresponding to an interference pattern of an interference light, of the target may be formed by irradiating the interference light of the laser beam.

18 Claims, 3 Drawing Sheets

MATERIAL FOR ORGANIC ELECTROLUMINESCENT DEVICE AND ITS MANUFACTURING METHOD

This application is the national phase under 35 U.S.C. §371 of PCT International Application No. PCT/JP01/1096 which has an International filing date of Dec. 14, 2001, which designated the United States of America.

TECHNICAL FIELD

The present invention relates to a process for producing a material for an organic electroluminescent device by implanting or injecting an emission center-forming compound by molecular implantation with laser, a material for an organic electroluminescent device obtained by this process, and to an organic electroluminescent device (elements) produced with this organic electroluminescent device material.

BACKGROUND ART

Electroluminescent devices (hereinafter, occasionally referred to simply as EL devices) have generally been classified as inorganic EL devices or organic EL devices according to the materials they are made from. Some inorganic EL devices utilizing inorganic fluorescent molecules are in practical use partly, and have been brought into application to the backlight of clocks or the like. Meanwhile, organic EL devices have been desired to be brought into practical use because of their being more excellent in high brightness or luminance, high efficiency, and high-speed response than inorganic ones.

Electroluminescent devices are constituted of a compound or compounds having an electron-transporting function, a hole-transporting function, and an emission center-forming function. As for their structures, there have been reported devices of the single-layer mode having a single layer provided with all the functions mentioned above, and those of the multilayer-mode composed of layers each having different functions. The principle of light emission is considered to be based on the phenomenon that electrons or holes injected from a pair of electrodes recombine within a light-emitting layer to form excitons, exciting the molecules of a light emissive material for the light-emitting layer.

As a compound constituting each layer, a low-molecular weight compound of high light-emission efficiency, a macromolecular compound having a high physical strength, or the like is employed. When a low-molecular weight compound is used, a film is formed by means of a vapor deposition technique, while a macromolecular compound is formed into a film by coating or applying a solution in many cases.

Japanese Patent Application Laid-Open No. 96959/1996 (JP-A-8-96959) and Japanese Patent Application Laid-Open No. 63770/1997 (JP-A-9-63770) disclose organic EL devices comprising a single light-emitting layer made of a polymer binder having both electron-transporting function and hole-transporting function, within which varieties of fluorescent dyes (or colorants, pigments) are dispersed. These organic EL devises are reported to present, as a whole, white light due to the light emission of each light-emitting compound independent of one another. Moreover, as compared with organic EL devices of the multilayer-mode, those of the single-layer mode are hardly deteriorated in light-emission intensity.

Fine patterning, particularly multicolor patterning (full-coloration) of these organic EL devices is difficult because, in their fabrication, a film is formed by means of a solution coating technique in which a solution of a polymer binder and a fluorescent dye(s) dispersed in a specific solvent is applied onto a substrate.

As multicolor patterning methods, a color filter method, a color-converting method, the ink-jet method by T. R. Hebner (Appl. Phys. Lett. 72, 5 (1998), p.519), the photobleaching method by Kido, et al, and others have been reported.

The color filter method or color-converting method has the advantage of not requiring the patterning of a light-emitting layer, but suffers deterioration in conversion efficiency caused by the use of a filter. In the ink-jet method, since a pattern formed by ink-jet printing shows a center-raised, i.e., conical profile and is inferior in smoothness of its surface, it is difficult to provide electrodes thereon uniformly. Moreover, the cross section of the pattern is desired to be rectangular, but that of a pattern by ink-jet printing is circular. Further, the dimensions of a pattern largely depend on conditions under which the pattern is dried and the concentration of the solution. In the photobleaching method, only a special emission center-forming compound which loses its fluorescence upon UV oxidation is employable and therefore colors expressible by EL devices are limited.

As was described above, in conventional film-forming methods by solution coating, although it is possible to use a macromolecular compound with a high physical strength, it is difficult to provide fine patterns. In addition to that, also in the above-described patterning methods, compounds that can be used are limited, and films having surface smoothness suitable for organic EL devices cannot be obtained.

As the molecular implantation technique, Japanese Patent Application Laid-Open No. 297457/1994 (JP-A-6-297457) discloses a method comprising a step of, with a functional material or a solid material containing a functional material (A) and a solid material into which a functional component is to be implanted (B) placed such as to face each other, irradiating a laser pulse thereby to implant the functional component into the solid material (B). The literature describes that a position to be implanted of the functional component can be controlled by adjusting an irradiation position of the laser.

Japanese Patent Application Laid-Open No. 106006/1996 (JP-A-8-106006) discloses a method comprising the steps of bringing a source film of an organic macromolecular compound within which dyes absorptive of a pulse laser are dispersed into tight contact with a target film of an organic macromolecular compound transmittable of a pulse laser, and irradiating a pulse laser from the target film side with an intensity of or below the ablation threshold value of the source film thereby to implant the dyes into the target film. This literature says that the molecular implantation technique can be utilized in the fabrication of color filters for use in displays or the like. Moreover, the literature describes that an image can be formed by moving a spot position of the laser, or the source film and the target film. In Examples of the literature, moving a sample in parallel forms a linear image.

Japanese Patent Application Laid-Open No. 150158/2000 (JP-A-2000-150158) discloses a process of producing a material for use in an organic electroluminescent device, in which a source containing an emission center-forming compound absorptive of a laser beam is brought into contact with a target having an electron-transporting function and/or a hole-transporting function and the source is irradiated with a pulsed laser beam with an intensity not higher than the ablation threshold of the source thereby to inject the emission center-forming compound into the target. This specification describes that irradiation of a laser beam through a photomask realizes unrestricted setting of a pattern form.

Accordingly, an object of the present invention is to provide a material for organic EL device (particularly, an organic EL device-use film) capable of minute and fine patterning even when a macromolecular compound is used as an EL device-use material and capable of implanting or injecting the emission center-forming compound simply and efficiently, a process for producing the same, and a material for an organic EL device, which is obtained by the process.

Another object of the present invention is to provide a material for an organic EL device, which is excellent in surface smoothness and has good contactness with electrodes, and an organic EL device using the same.

DISCLOSURE OF INVENTION

The inventors of the present invention made intensive and extensive studies to achieve the above objects, and finally found that, in a molecular implantation technique using a source constituted of an emission center-forming compound, fine patterning is realized simply and effectively by a process comprising (1) implanting or injecting an emission center-forming compound into a target by relatively moving a laser beam relative to the target, or (2) implanting or injecting an emission center-forming compound into a target with the use of an interference light of a laser. The present invention was accomplished based on the above findings.

That is, a process for producing a material for an organic electroluminescent device of the present invention comprises implanting an emission center-forming compound constituting a source into a target having at least one function selected from the group consisting of an electron-transporting function and a hole-transporting function by irradiating a laser beam, and wherein (1) the laser beam and at least the target are relatively moved with irradiating the beam to form the emission center with a predetermined pattern, or (2) the emission center at an area, corresponding to an interference pattern of an interference light, of the target is formed by irradiating the interference light of the laser beam.

In the method (1), the source and the target being in contact with each other may be moved relative to the laser beam for forming the emission center with a predetermined pattern. Moreover, the irradiation of the laser beam may be conducted through a waveguide, or the irradiation of the laser beam may be conducted with the use of an optical fiber. Further, the laser beam and the target may be relatively moved with irradiating the beam and with moving the source relative to the beam for forming the emission center. The laser beam may comprise a pulse laser beam. The laser beam and the target may be relatively moved with synchronizing the beam with a cycle of the pulse.

In the method (2), a laser beam from a single light source may be split into a plurality of light paths to cause the interference by an optical path difference. For example, the interference may be caused by introducing the laser beam into a hole or a slit, or the interference may be caused by reflecting the laser beam through a plurality of reflection paths.

The methods (1) and (2) may comprise irradiating the laser beam with an intensity of or below the ablation threshold value of the source. The laser beam may comprise a pulse laser beam. The target may comprise an organic polymer. The target may comprise a compound having at least one function selected from the group consisting of the electron-transporting function and the hole-transporting function, and a film-formable organic polymer. The compound may comprise an oxadiazole derivative having the electron-transporting function, and/or an aromatic tertiary amine having the hole-transporting function.

The present invention also includes a material for an organic electroluminescent device, which is obtainable by the above-mentioned process, and an organic electroluminescent device using the material for an organic electroluminescent device.

Figure 1:
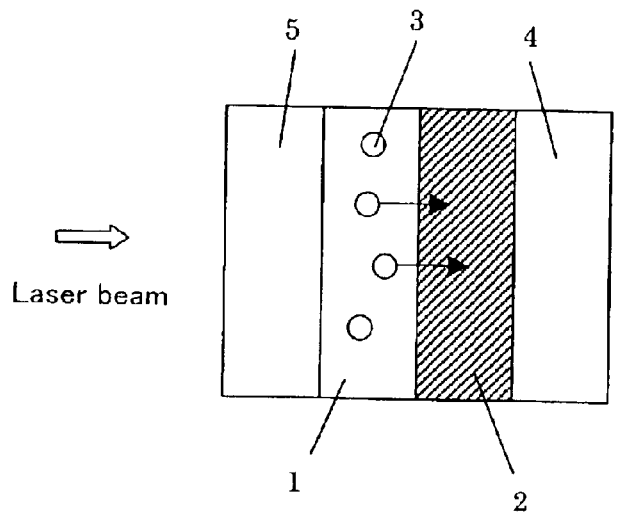
FIG. 1 is a schematic view explaining the method (1), which is one embodiment of a technique of implanting or injecting an emission center-forming compound.

As the emission center-forming compound, a compound having function as an emission center-forming compound for organic EL device and being absorptive of laser beams, in particular a compound emitting a light by being excited by an electron and/or a hole (positive hole), can be utilized. The emission center-forming compound includes a heterocyclic compound containing at least one hetero atom selected from oxygen, nitrogen and sulfur atoms, e.g., a bis ($C_{1-6}$alkylbenzoxazolyl)thiophene such as 2,5-bis(5-tert-butyl-2-benzoxazolyl)-thiophene, nile red, a coumarin such as coumarin 6 and coumarin 7, a 4-(dicyano$C_{1-4}$alkylene)-2-$C_{1-4}$alkyl-6-(p-di$C_{1-4}$alkylaminostyryl)-4H-pyran such as 4-(dicyanomethylene)-2-methyl-6-(p-dimethylaminostyryl)-4H-pyran, and quinacridone; a condensed polycyclic hydrocarbon such as rubrene and perylene; a tetra$C_{6-12}$aryl-1, 3-butadiene such as 1,1,4,4-tetraphenyl-1,3-butadiene (TPB); a bis(2-(4-$C_{1-4}$alkylphenyl)$C_{2-4}$alkynyl)benzene such as 1,4-bis(2-(4-ethylphenyl)ethynyl)benzene; and a bis(2,2'-di$C_{6-12}$arylvinyl)biphenyl such as 4,4'-bis(2,2'-diphenylvinyl) biphenyl. Among them, nile red and coumarin 6 are particularly preferable.

BEST MODE FOR CARRYING OUT THE INVENTION

[Source (A)]

The source need only contain at least an emission center-forming compound, and may be comprised of the emission center-forming compound singly, or of the emission center-forming compound and a binder.

(Emission Center-forming Compound)

As the emission center-forming compound, a compound having function as an emission center-forming compound for organic EL device and being absorptive of laser beams, in particular a compound emitting a light by being excited by an electron and/or a hole (positive hole), can be utilized. The emission center-forming compound includes a heterocyclic compound containing at least one hetero atom selected from oxygen, nitrogen and sulfur atoms [e.g., a bis($C_{1-6}$alkyl-benzoxazoyl)thiophene such as 2,5-bis(5-tert-butyl-2-benzoxazoyl)-thiophene, nile red, a coumarin such as coumarin 6 and coumarin 7, a 4-(dicyano$C_{1-4}$alkylene)-2-$C_{1-4}$alkyl-6-(p-di$C_{1-4}$alkylaminostyryl)-4H-pyran such as 4-(dicyanomethylene)-2-methyl-6-(p-dimethylaminostyryl)-4H-pyran, and quinacridone]; a condensed polycyclic hydrocarbon such as rubrene and perylene; a tetra$C_{6-12}$aryl-1,3-butadiene such as 1,1,4,4-tetraphenyl-1,3-butadiene (TPB); a bis(2-(4-$C_{1-4}$alkylphenyl)$C_{2-4}$alkynyl)benzene such as 1,4-bis(2-(4-ethylphenyl)ethynyl)benzene; and a bis(2,2'-di$C_{6-12}$arylvinyl)biphenyl such as 4,4'-bis(2,2'-diphenylvinyl)biphenyl. Among them, nile red and coumarin 6 are particularly preferable.

The structures of nile red and coumarin 6 are shown below:

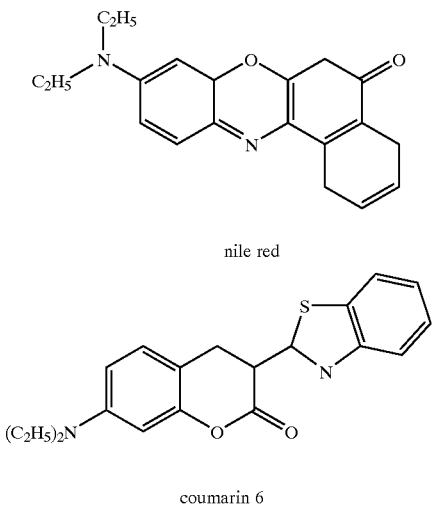

nile red coumarin 6

The wavelength of light emitted by nile red is 580 nm (emission of red light) and that of coumarin 6 is 490 nm (emission of green light).

These emission center-forming compounds may be used either singly or in combination.

(Binder) As the binder, usually, a resin having film-forming properties (e.g., a thermoplastic resin, a thermosetting resin) can be used.

Examples of the thermoplastic resin are a olefinic resin such as a polyethylene, a polypropylene, an ethylene-propylene copolymer and a polybutene; a styrenic resin such as a polystyrene, a rubber-modified (or rubber-containing, rubber-reinforced) polystyrene (HIPS), an acrylonitrile-styrene copolymer and an acrylonitrile-butadiene-styrene copolymer; an acrylic resin [for example, a homo- or copolymer of a (meth)acrylic monomer (e.g., a $C_{1-6}$alkyl (meth)acrylate such as methyl (meth)acrylate, ethyl (meth)acrylate and butyl (meth)acrylate, a hydroxy$C_{2-4}$alkyl (meth)acrylate such as hydroxyethyl (meth)acrylate and hydroxypropyl (meth)acrylate, glycidyl (meth)acrylate, (meth)acrylic acid, and (meth)acrylonitrile), a copolymer of the (meth)acrylic monomer and a copolymerizable monomer (e.g., an aromatic vinyl monomer such as styrene) (for example, a methyl methacrylate-styrene copolymer)]; a vinyl alcohol-series polymer such as a polyvinyl alcohol and an ethylene-vinyl alcohol copolymer, a vinyl-series resin such as a polyvinyl chloride, a vinyl chloride-vinyl acetate copolymer, a polyvinylidene chloride, a polyvinyl acetate, an ethylene-vinyl acetate copolymer and a polyvinyl acetyl; a polyamide-series resin such as a 6-nylon, a 6,6-nylon, a 6,10-nylon and a 6,12-nylon; a polyester resin [for example, an alkylene arylate-series resin such as a polyalkylene terephthalate (e.g., a polyethylene terephthalate and a polybutylene terephthalate) and a polyalkylene naphthalate, or alkylene arylate copolyester resin]; a fluorine-containing resin; a polycarbonate; a polyacetal; a polyphenylene ether; a polyphenylene sulfide; a polyether sulfone; a polyether ketone; a thermoplastic polyimide; a thermoplastic polyurethane; and a norbornene-series polymer.

Exemplified as the thermosetting resin are a phenolic resin, an amino resin (e.g., a urea resin and a melamine resin), a thermosetting acrylic resin, an unsaturated polyester resin, an alkyd resin, a diallyl phthalate resin, an epoxy resin, and a silicone resin.

The binder may be used singly or in combination.

The content of the emission center-forming compound in the source is not particularly limited to a specific content, and is about 0.1 to 100% by weight, preferably about 1 to 90% by weight, and more preferably about 5 to 80% by weight. Moreover, in the case where the source comprises an emission center-forming compound and a binder, the content of the emission center-forming compound is not particularly limited to a specific content, and for example is about 0.1 to 60 parts by weight, preferably about 1 to 30 parts by weight, and more preferably about 3 to 20 parts by weight relative to 100 parts by weight of the binder.

The source is usually used in the form of a film. Moreover, the source may be a film or coat of the above emission center-forming compound singly formed on the substrate or the target, or that of the above emission center-forming compound and the binder. In the case of irradiating a laser beam from the source side, the substrate need only be sufficiently transparent to transmit laser beams, examples of which are a glass plate such as a soda glass, a no-alkali glass, and a quartz glass; and a polymer sheet or film of a polyester, a polystyrene, an acrylic resin, a vinyl-series resin (e.g., a polyvinyl acetal), a polysulfone, and of a polyethersulfone.

There is no particular restriction as to a process of forming a source film, and a conventional process [e.g., dry processes such as vapor deposition (vacuum deposition), wet coating processes that use a solvent, such as spin coating, dip coating and die coating] may be employed. Incidentally, the film may be formed in accordance with a conventional film-forming process (e.g., casting method and extrusion method).

If necessary, into the coating agent (coating liquid) for forming a coat (coating film) of the source, i.e., the source may be incorporated a solvent (e.g., water; alcohols such as methanol and ethanol; esters such as ethyl acetate and isobutyl acetate; ketones such as acetone and methyl ethyl ketone; aromatic hydrocarbons such as toluene; alicyclic hydrocarbons such as cyclohexane; halogenated hydrocarbons such as chloroform and chlorobenzene; ethers; cellosolves; carbitols). The thickness of the film (coat) may be about 0.01 to 50 µm, preferably about 0.1 to 30 µm, and more preferably about 0.5 to 20 µm.

Moreover, the source may not be defined in a pattern, or the source itself may be defined in a given pattern. A film (layer, deposit) defined in a pattern, if necessary, on a substrate (base material) or a target may be used as a source.

For example, a film or sheet comprising an emission center-forming compound may be patterned by punching or other means to give a source. Moreover, the substrate need only be sufficiently transparent to transmit laser beams, examples of which are a glass plate such as a soda glass, a no-alkali glass, and a quartz glass; and a polymer sheet or film of a polyester, a polystyrene, an acrylic resin, a vinyl-series resin (e.g., a polyvinyl acetal), a polysulfone, and of a polyethersulfone.

In the case of defining into a pattern of a source, the pattern is selected according to the intended application, and for example may be any of a one dimensional pattern [a dotted pattern, a lined pattern (e.g., parallel, random, grid)] and a two-dimensional pattern [a plane pattern (e.g., circular, oval, polygonal such as triangle and rectangle, star-shaped)]. The predetermined pattern is provided on the substrate or the target by, for example, printing such as screen printing, ink jet system, melt or thermal transfer, or vapor deposition (sublimation printing) involving masking.

[Target (B)]

Insofar as the target has at least one function selected from the electron-transporting function and the hole-transporting function, there is no particular restriction, and the target may be (I) a resin having at least one function selected from the electron-transporting function and the hole-transporting function, or (II) a resin composition comprising a resin which inherently has neither the electron-transporting function nor the hole-transporting function but given with at least one function selected from these. As the resins for the use of (I) and (II), resins (binder) having film- or coat-forming properties are preferred. Moreover, when the laser beam is incident from the side of the target, the target is transmittable of the laser beam.

Exemplified as the resin (I) having at least one function selected from the electron-transporting and hole-transporting functions is a polyphenylenevinylene [for example, a homo- or copolymer of a $C_{6-12}$arylenevinylene, which may have a substituent (e.g., a $C_{1-10}$alkoxy group), such as a polyphenylenevinylene, a poly(2,5-dimethoxyphenylenevinylene) and a polynaphthalenevinylene]; a polyphenylene (in particular, a polyparaphenylene) [for example, a homo- or copolymer of a phenylene, which may have a substituent (e.g., a $C_{1-10}$alkoxy group), such as a polyparaphenylene and a poly-2,5-dimethoxyparaphenylene]; a polythiophene [a homo- or copolymer of a poly$C_{1-20}$alkylthiophene such as a poly(3-alkylthiophene), a poly$C_{3-20}$cycloalkylthiophene such as a poly(3-cyclohexylthiophene), and a $C_{6-20}$arylthiophene, which may have a substituent (e.g., a $C_{1-10}$alkyl group), such as a poly(3-(4-n-hexylphenyl) thiophene)]; a polyfluorene such as a poly$C_{1-20}$alkylfluorene; a vinyl-series polymers having at least one functional group selected from a hole-transporting functional group and an electron-transporting functional group in the main or side chain, such as a poly-N-vinylcarbazole (PVK), a poly-4-N,N-diphenylaminostyrene, a poly(N-p-diphenylamino)phenylmethacrylamide), a poly(N,N'-diphenyl-N,N'-bis(3-methylphenyl)-1,1'-biphenyl-4,4'-diaminomethacrylamide) (PTPDMA) and a poly-4-(5-naphthyl-1,3,4-oxadiazole)styrene; a poly$C_{1-4}$alkylphenylsilane such as a polymethylphenylsilane; a polymer having an aromatic amine derivative in a side or main chain thereof; and a copolymer thereof. The resin can be used either singly or in combination. The preferred target includes a copolymer comprising a poly-N-vinylcarbazole or N-vinylcarbazole as a main component (not less than 50% by weight, and preferably about 60 to 98% by weight), and a polymer having an aromatic amine derivative in a side chain or main chain thereof.

PVK is amorphous and excellent in heat resistance (glass transition temperature Tg: 224° C.). The degree of polymerization of PVK is not particularly restricted, and is, for example, about 200 to 5,000 (e.g., 300 to 3,000), and preferably about 500 to 2,000 (e.g., 500 to 1,500).

Further, if needed, the electron- or hole-transporting function may be given to the resin (I).

Examples of the compound having an electron-transporting function are: an oxadiazole derivative, for example, an oxadiazole derivative having a $C_{6-20}$aryl group which may have a substituent, such as 2-(4-biphenyl)-5-(4-tert-butyiphenyl)-1,3,4-oxadiazole (PBD), 2,5-bis(1-naphtyl)-1,3,4-oxadiazole (BND), 1,3-bis[5-(4-tert-butylphenyl)-1,3,4-oxadiazole)]benzene (BPOB), 1,3,5-tris [5-(4-tert-butyiphenyl)-1,3,4-oxadiazole]benzene (TPOB) and 1,3,5-tris[5-(1-naphtyl)-1,3,4-oxadiazole[benzene (TNOB); a diphenoquinone for example, a diphenoquinone which may have a substituent (e.g., a $C_{1-10}$alkyl group), such as 3,5,3',5'-tetrakis-tert-butyldiphenoquione; 1,2,3,4,5-pentaphenyl-1,3-cyclopentadiene (PPCP); and a quinolinic acid complex such as a tris(8-quinolinorato)aluminum (III) complex, a bis(benzoquinolinolato)beryllium complex and a tris(10-hydroxybenzo quinolilato)beryllium complex. PBD is particularly preferred.

As the compound having a hole-transporting function, there may be exemplified an aromatic tertiary amine such as N,N'-diphenyl-N,N'-bis(3-methylphenyl)-1,1'-biphenyl-4,4'-diamine (TPD), N,N'-diphenyl-N,N'-bis(1-naphthyl)-1,1'-biphenyl-4,4'-diamine (NPD), 1,1-bis[(di-4-tolylamino) phenyl]cyclohexane, N,N,N'N'-tetra(3-methylphenyl)-1,3-diaminobenzene (PDA), 4,4',4"-tris(3-methylphenylphenylamino)triphenylamine (m-MTDATA), 4,4',4"-tris(1-naphthylphenylamino)triphenylamine(1-TNATA), 4,4',4"-tris(2-naphthylphenylamino) triphenylamine (2-TNATA), 4,4',4"-tri(N-carbazolyl) triphenylamine (TCTA), 1,3,5-tris[4-(3-methylphenylphenylamino)phenyl]benzene (m-MTDAPB) and triphenylamine; and a phthalocyanine.

The above compound can be used either singly or in combination. Incidentally, among these compounds, a compound emitting a light by being excited by an electron and/or a hole may be used as an emission center-forming compound.

The proportion of the above-mentioned component contained in the resin (I) (e.g., PVK) can be selected within the range not adversely affecting the functions qualifying the resin as an organic EL device material, and is, for example, about 10 to 300 parts by weight, and preferably about 20 to 200 parts by weight relative to 100 parts by weight of the resin (I).

When the target is constituted of the resin (I) and the compound described above, the organic EL device which will later be described can be made so as to have a single-layered structure, and the organic EL device so fabricated not only has improved luminous efficiency but also is economically advantageous.

There is no specific restriction as to a resin to be used in the resin composition (II), and such a variety of above-mentioned binders having the film-forming properties (e.g., thermoplastic resins, thermosetting resins) are available. At least one function selected from the electron-transporting function and the hole-transporting function may be given to these resins. Exemplified as the compound(s) to be used to provide the electron- or hole-transporting function are compounds similar to those listed above.

The amount of the compound having an electron-transporting or hole-transporting function to be added is about 10 to 300 parts by weight (e.g., about 10 to 200 parts by weight) and preferably about 20 to 100 parts by weight (e.g., about 20 to 80 parts by weight) relative to 100 parts by weight of the binder resin.

The resin (I) and the resin composition (II) may be used in combination, and such combined material may further be given at least one function selected from the electron-transporting function and the hole-transporting function.

Incidentally, a form (shape or configuration) of the target is not particularly limited to a specific form, and usually, is used in the form of a film. Moreover, the target is formed in the same manner as in the source, and usually is formed on the above-mentioned substrate.

[Production Process of Material for Organic EL Device (Molecular Implantation)]

The process for producing materials for organic EL devices of the present invention comprises implanting an emission center-forming compound in a source into the target by irradiating (or exposing) a laser beam, and wherein (1) the laser beam and at least the target are relatively moved with irradiating the beam to form the emission center with a predetermined pattern, or (2) the emission center at an area, corresponding to an interference pattern of an interference light, of the target is formed by irradiating the interference light of the laser beam. The laser beam may be irradiated from the source (A) side or the target (B) side. As the target, a film is usually employed to produce a film for an organic EL device. Moreover, the target may be brought into contact with the source.

Exemplified as the laser beam to be used in the present invention are, though it differs with the species of the emission center-forming compound to be used, those having an oscillation wavelength within the range of 190 to 1,100 nm. When using a pulse laser beam (pulsed laser beam), the frequency is about 0.5 to 50 Hz and preferably about 0.5 to 30 Hz. Moreover, although the pulse width varies with the wavelength of the laser beam, it is about 10 ps to 10 $\mu$s (e.g., about 10 ps to 1 $\mu$s), preferably about 50 ps to 100 ns (e.g., about 100 ps to 50 ns). The shorter the pulse width (duration) is, the less the decomposition of the emission center-forming compound occurs, and therefore, the emission center-forming compound is hardly damaged.

Exemplified as the source of the laser beam are gas laser [ArF excimer laser (193 nm), KrF excimer laser (248 nm), XeCl excimer laser (308 nm), XeF excimer laser (351 nm), nitrogen laser (337 nm)], dye laser [nitrogen laser, excimer laser, or YAG laser excitation, 300 to 1,000 nm], solid-state laser [(Nd:YAG excitation, semiconductor laser excitation, etc.), ruby laser (694 nm), semiconductor laser (650 to 980 nm), tunable diode laser (630 to 1,550 nm), titanium-sapphire laser (Nd:YAG excitation, 345 to 500 nm, 690 to 1,000 nm), and Nd:YAG laser (FHG: 266 nm, THG: 354 nm, SHG: 532 nm, fundamental wave: 1,064 nm)].

In the production process of the present invention, irradiation of a laser beam with an intensity of or below the ablation threshold of the source (that is, the emission center-forming compound or binder) makes it possible to effectively implant the emission center-forming compound into the target. The amount of the emission center-forming compound to be implanted can be controlled by regulating, e.g., the intensity and wavelength of the laser beam, and the number of times the laser beam is shot.

The ablation threshold of the source (A) varies with the species of the emission center-forming compound constituting the source. Moreover, the ablation threshold also depends on the wavelength and pulse width of the laser beam. Therefore, in the present invention, the ablation threshold is defined as follows.

The term "ablation threshold value" used in the present invention is defined as a term referring to, assuming that a source is irradiated with one shot of a laser beam and observed by a contact-type (mode) surface morphology measuring apparatus (e.g., DEKTAK3030ST, manufactured by SLOAN), the lowest laser intensity (mJ/cm$^2$) measured on the surface irradiated with the laser beam at which the surface might suffer changes in surface conditions by a depth of 50 nm or more. The source and the laser beam are the same as those employed in the present invention.

Figure 2:
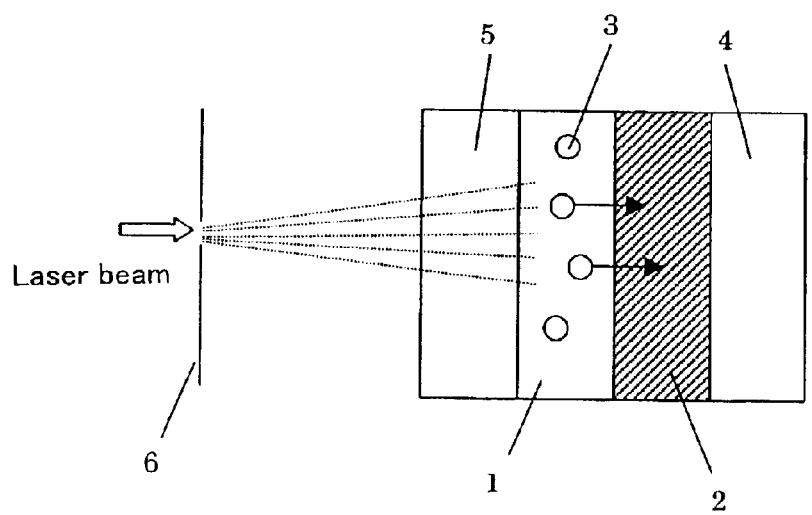
FIG. 2 is a schematic view explaining the method (2), which is another embodiment of a technique of implanting or injecting an emission center-forming compound.

Hereinafter, the process of the present invention for producing a material for use in an organic EL device (particularly, films for use in organic EL devices) will be described with reference to Figures. FIG. 1 shows a schematic view showing a production process in the method (1) of the present invention. FIG. 2 shows a schematic view showing a production process in the method (2) of the present invention. A source 1, a target 2, an emission center-forming compound 3, a substrate resided in the target side 4, a substrate resided in the source side 5, and a hole 6 are illustrated in Figures.

According to FIG. 1, firstly, the source 1 formed on the substrate 5 is brought into contact with or closely contact with the target 2 formed on the substrate 4, and irradiated with a laser beam with an intensity of or below the ablation threshold of the source from the source 1 side with relatively moving the beam relative to the target. The emission center-forming compound, which absorbed the laser beam, obtains high translational energy and is injected or implanted into the target 2 without being decomposed, and a material for an organic EL device (particularly, a film) is obtained.

According to FIG. 2, firstly, the source 1 formed on the substrate 5 is brought into contact with or closely contact with the target 2 formed on the substrate 4, and irradiated with a laser beam with an intensity of or below the ablation threshold of the source from the source 1 side with causing an interference by introducing the beam into a hole 6. The emission center-forming compound, which absorbed the laser beam, obtains high translational energy and is injected or implanted into an area, corresponding to an interference pattern of the interference light, of the target 2 without being decomposed, and a material for an organic EL device (particularly, a film) is obtained.

In the methods (1) and (2), the laser beam is shot about 1 to 200 times, preferably about 1 to 150 times, and more preferably about 1 to 100 times (e.g., about 5 to 50 times). Moreover, the laser beam may be shot from the target side. Incidentally, the source may be formed on the target directly as a surface layer. The source formed on the target can be removed from the target easily after implanting the emission-center compound. Moreover, the source may be formed by a surface layer removable or separable from the target.

The substrate to be used need only have sufficient transparency to transmit a laser beam, examples of which are the above-mentioned substrates (e.g., a glass plate such as a quartz glass, a polymer sheet or film). As the substrate, a substrate used on forming of a source or a target film may be employed without modification, or a substrate produced freshly may be employed.

In the process for producing the material for the organic EL device of the present invention, there is no particular restriction as to the shape that the cross-section of the laser beam takes, and it may be circular, oval, or polygonal (e.g., triangle, rectangle). The average beam area of the laser beam is not particularly limited to a specific area, and can be selected from a wide range for any purpose. For example, the area is about 0.01 to 5,000 $\mu m^2$, preferably about 0.1 to 4,000 $\mu m^2$, and more preferably about 1 to 3,000 $\mu m^2$. Incidentally, in the method (1), a pattern may be defined or formed by narrowing an area of a laser beam down a desired size and scanning a predetermined pattern, or an emission center-forming compound may be implanted into a target in a predetermined area by enlarging the area of the laser beam to use a source having a predetermined pattern or relatively scanning a laser beam through a photomask.

Moreover, a plurality of sources having emission center-forming compounds different from one another may be employed. For example, the use of a compound capable of emitting a light in visible light region (a compound capable of emitting a light such as yellow, red, green or blue) realizes a desired emission color. Moreover, in the method (2), the use of a plurality of sources realizes that an emission light such as red, green and blue can be arranged or arrayed as corresponding to an interference fringe or pattern (e.g., vertical stripe, delta arrangement and tetragonal arrangement). Therefore, the present invention makes it possible to obtain materials for organic EL devices capable of emitting various colors and having various patterns.

The method (1) has a characteristic that the laser beam and at least the target are relatively moved for implanting an emission center-forming compound of a source into the target with a predetermined pattern. In the method (1), the source and the target are contacted with each other and positioned, and the source may be moved with the target, or the source may be movable relative to the target relatively. In the case where the source and the target are contacted with each other, an irradiation of a laser beam may, for example, be conducted either by (1—1) moving a light path of the laser beam relative to the source and the target, or by (1-2) moving the source and the target relative to a light path of the laser beam. Furthermore, in these methods, the light path of the laser beam is movable not only by moving a laser light source relatively but also (1-3) by using means for controlling the light path.

The means for controlling the light path includes a process of utilizing physical means or physico-optical means [for example, an optical device (or optical member) such as an optical fiber, a reflection mirror (e.g., a total reflection mirror, a half reflection mirror), a lens (e.g., condenser) and a deflecting prism, or means in combination with them], a process of utilizing electro-optical means [(e.g., applying a voltage to an electro-optical crystal (a birefringent crystal)] to move a light path of a light beam of a waveguide, and a process of utilizing supersonic waves. Incidentally, in a process of utilizing supersonic waves, the waveguide can be moved by using a crystalline material (such as water, a chalcogenide-series vitreous material, $PbMoO_4$, $TeO_2$, Ge, $LiNbO_3$ and GaP) as a medium, and applying a voltage to the medium through a piezoelectric thin film transducer (e.g., a piezoelectric device such as $LiNbO_3$ and ZnO) to generate supersonic waves to the medium.

In the physical means or physico-optical means, when the light path of the laser beam is moved by utilizing an optical fiber, a diffusion loss of the laser beam can be reduced, and efficient and fine patterning can be conducted simply.

Incidentally, according to the method (1), the laser beam is capable of moving relatively and two-dimensionally relative to at least a target. Therefore, an emission center-forming compound of a source can be implanted into a target with a predetermined pattern efficiently, and the emission center can be formed in the form of a two-dimensional pattern.

For example, precise positioning is realized easily and two-dimensional fine patterning is realized, by bringing a source into contact with a target, fixing them on a table movable for X-Y axial direction with turning up a target surface or source surface, setting up a sensor for detecting a displacement from a reference position of the target (or source) to X-axial and Y-axial directions, and moving the table to X-axial and Y-axial directions in response to a detection signal obtained from the sensor. Incidentally, if necessary, by setting up a memory memorized a data of the pattern, and a controller for moving the laser and/or the table in response to the pattern signal, patterning can be conducted simply.

In the case where a pulse laser is used as a laser beam, a target and a laser beam are relatively shifted by relatively moving the laser beam relative to at least the target according to the above-mentioned manner by synchronizing with a pulse cycle, and an emission center-forming compound can be implanted into a target efficiently. In the process, the target may be moved relative to the laser beam, and usually synchronizing with pulse cycle controls the laser beam or a light path of the laser beam.

Further, according to the present invention, a laser beam may be relatively moved relative to at least a target, and a source may be moved relative to the laser beam. Incidentally, by repeated irradiation of a laser beam to the same site of the source is consumed an emission center-forming compound, and is unable to form an emission center efficiently. In such a case, relative movement of the laser beam and the target with irradiating the laser beam and with relatively moving the source relative to the laser beam realizes that an emission center-forming compound is implanted into the target effectively and efficiently.

For example, a plurality of emission centers different from each other in emission color (e.g., emission centers having full-color) can be also formed efficiently. According to the method (1), a plurality of areas comprising each of emission center-forming compounds (e.g., an area comprising a yellow emission center-forming compound, an area comprising a red emission center-forming compound, and an area comprising a blue emission center-forming compound) may be formed into a source. The use of such a source ensures that a plurality of emission centers different from each other in emission color can be formed with use of a single source by relatively moving the source relative to the laser beam and/or the target toward X-axial and/or Y-axial direction(s).

Figure 7:
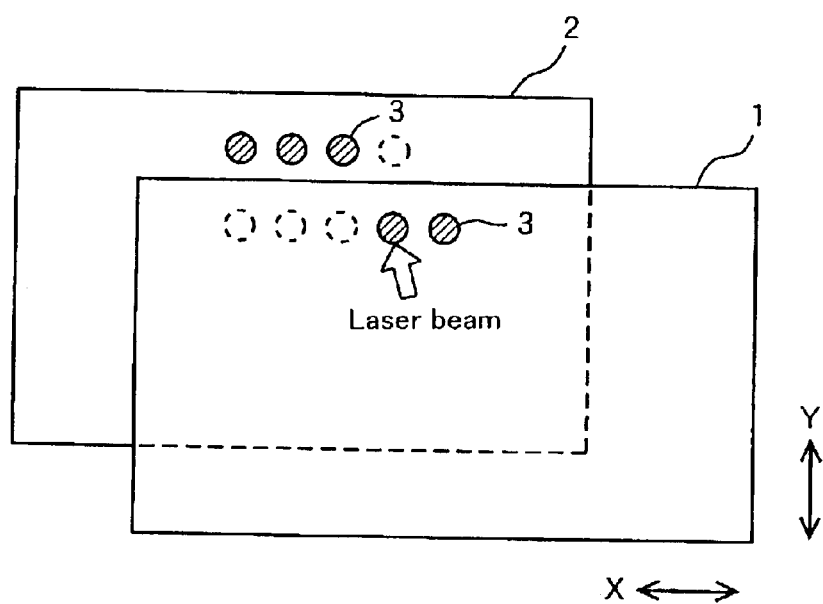
FIG. 7 is a schematic view explaining another production process according to the method (1) of the present invention.

FIG. 7 shows a schematic view explaining another production process according to the method (1). In the embodiment, a production process of a red emission center comprises moving a light path of a laser beam (light source or waveguide) relative to a target toward a longitudinal direction and/or a lateral direction, irradiating (or exposing) the laser beam to an area comprising a green emission center-forming compound of a source to form a green emission center into the target, moving the source relative to the laser beam, then irradiating the laser beam to an area comprising a red emission center-forming compound to form a red emission center into the target. Further, a blue emission center is produced in the same manner as described above, and a material for an organic EL device capable of emitting a full-colored light can be produced. Moreover, according to the method, a pulse laser is irradiated (or emitted) to the target through the source with scanning toward a longitudinal direction and/or a lateral direction, and the source 1 and the target 2 is capable of contacting with each other at an irradiation site of the laser beam. Incidentally, the source 1 is movable to X-axial and/or Y-axial direction(s) by means of a feed apparatus.

In this way, when the source is moved relative to the laser beam, the use of a single source realizes that a plurality of emission centers different from each other in emission color are produced. An emission center-forming compound is used without wasting, the emission center-forming compound is implanted efficiently, and the process is advantageous in terms of cost. Moreover, the source may be formed with an undefined length film or the like. The use of such a film realizes a continuous or successive production of an emission center-forming compound.

The method (2) has a characteristic that the utilization of high coherence (coherency) of a laser beam realizes a production of an emission center into an area corresponding to an interference pattern of an interference light in the target by the interference light of the laser beam. Incidentally, "interference" also includes diffraction (considered as an interference of small wave (secondary wave) by the Principle of Huygens) ("Basis and Experiment of Laser", Koreiwa Matsudaira, issued by Kyoritsu Shuppan, Co., Ltd., the 11th edition, page 54).

In the method (2), an interference of a laser beam may be obtained from optical path difference caused by splitting a laser beam from the single light source into a plurality of light paths. A process for interfering with a laser beam is not limited to one using a hole as shown in FIG. 2, and for example, may be conducted either by (2-1) introducing a laser beam into a hole or a slit to cause an interference, or by (2—2) reflecting a laser beam through a plurality of reflection paths capable of reflecting to cause an interference.

In the hole or the slit, a slit width (in case of the hole, the average hole diameter) is not particularly limited, and is about 0.01 to 100 mm, preferably about 0.1 to 10 mm, and more preferably about 0.5 to 5 mm (e.g., about 0.5 to 3 mm). Incidentally, there is no particular restriction as to a shape of the hole, and may be mentioned circular, oval, or polygonal (e.g., triangle, rectangle). In the case where the shape of the hole is noncircular, the average diameter means an average diameter of circumscribed circle of the hole.

Incidentally, the hole and the slit may be a single hole or slit, or each of them may be used plurally or in combination (e.g., double slit). Moreover, the hole and the slit may be used in combination. A laser beam guided by the hole or the slit is interfered by the optical path difference (in case of using a single hole or slit, diffracted), and interference fringe (or diffraction fringe) occurs.

In the method (2—2), a mirror (e.g., a semitransparent mirror, a reflecting mirror) is usually employed in order to reflect a laser beam. In particular, the use of a semitransparent mirror ensures that an optical path difference between a transmitted light and a reflected light generates simply. For example, the process comprises being incident a laser beam on a semitransparent mirror, which is disposed with gradient of a predetermined angle from an incident direction of the laser beam, transmitting part of the laser beam and reflecting the residual laser beam in an orthogonal direction to the incident direction of the laser beam. The transmitted light is incident on a first reflection mirror apart from the semitransparent mirror at a predetermined distance. On the other hand, the reflected light is incident on a second reflection mirror apart from the semitransparent mirror at a distance different from the above distance. A laser beam, which is obtained by reflecting with use of the first and the second reflection mirror, going through a different reflection path and being incident on the semitransparent mirror again, is incident on the target, and as a result, an interference occurs by an optical path difference. Moreover, by adjusting a distance between the transparent mirror and the reflection mirror, a desired interference pattern can be obtained.

Incidentally, each of the semitransparent mirror(s) and the reflection mirror(s) may be used singly or in combination. In order to be incident the laser beam on the semitransparent mirror efficiently, the laser beam may be made parallel pencil through a lens (such as a telemeter lens) and may be incident on the semitransparent mirror.

In such a method (2-1) or (2—2), a distance between interference fringes, or a shape (or form) of interference fringe can be adjusted by selecting parameters such as a hole diameter or a slit width and a mirror position suitably, and by varying an optical path distance. A desired interference pattern (interference fringe) can be obtained without through a mask and the like. In particular, when the hole diameter or the slit width is turned down to a wavelength of the laser beam, interference fringe having a fine distance can be obtained, and fine patterning of an emission center-forming compound can be conducted easily. Further, since the interference fringe is usually a concentric pattern (symmetric figure) in which a center energy is most highest, the amount to be implanted of the emission center-forming compound can be adjusted.

Moreover, the production process of the present invention realizes that an emission center-forming compound is implanted into a target not in a dispersed or diffused form but in a step form (that is, an oblong form, in which the depth of the compound implanted into the target is uniform). The depth is varied depending on a kind or species of the emission center-forming compound or the target, or intensity of a laser beam, and for example, is about 10 to 300 nm, preferably about 15 to 200 nm, and more preferably about 20 to 100 nm. Moreover, irradiation of the laser beam with an intensity of or below the ablation threshold value ensures that an emission center-forming compound is implanted efficiently without deterioration in surface smoothness of a material for an organic EL device.

[Organic Electroluminescent Device]

The organic electroluminescent device of the present invention comprises a material for an organic EL device obtained by the process described above (particularly, a light-emitting layer constituted of a target film into which an emission center-forming compound has been implanted) and a pair of electrodes.

As the anode, a transparent electrode formed by vacuum deposition or other methods (e.g., indium-tin-oxide (ITO) electrode) or the like is employed, and a highly conductive metal having a small work function (e.g., magnesium, lithium, aluminum, or silver) is used as the cathode. In the case where magnesium is employed as the cathode, the magnesium may be coevaporated with a small amount of silver (e.g., 1 to 10% by weight) for improving the adhesion with an organic EL device-use film.

When the light-emitting layer has both the electron-transporting function and the hole-transporting function, the organic EL device of the present invention can be made so as to have a single-layered structure. When the light-emitting layer is lacking in either the electron-transporting function or the hole-transporting function or when attempting to improve each function, a layer having the desired function may be laminated on the light-emitting layer by a conventional vapor deposition technique or a solution coating technique. These layers may be of low-molecular weight compounds or macromolecular compounds, and either will do. The organic EL device can take, for example, a single-layer structure or a multilayer-structure as shown in FIGS. 3 to 6.

Figure 3:
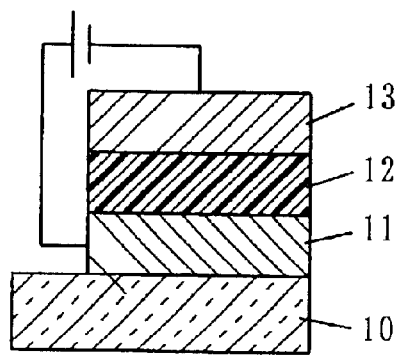
FIG. 3 is a schematic sectional view showing one embodiment (single-layer structure) of the organic electroluminescent device of the present invention.
Figure 4:
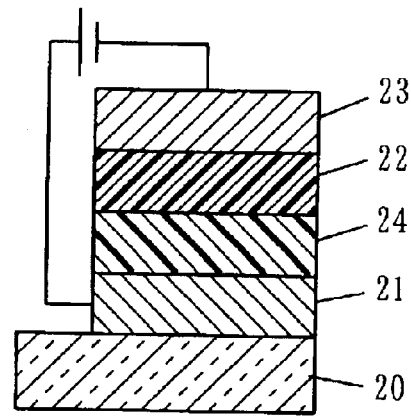
FIG. 4 is a schematic sectional view showing another embodiment (multilayered structure) of the organic electroluminescent device of the present invention.
Figure 5:
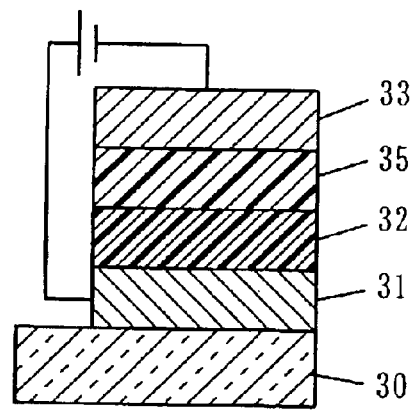
FIG. 5 is a schematic sectional view showing further another embodiment (multilayered structure) of the organic electroluminescent device of the present invention.
Figure 6:
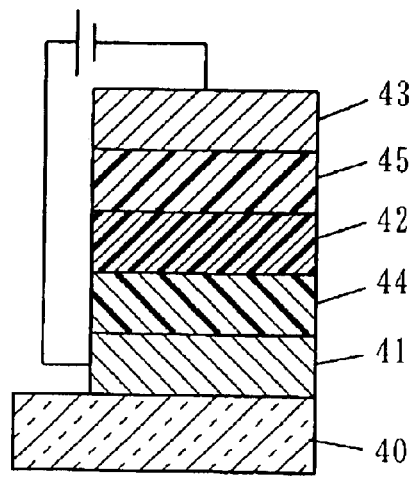
FIG. 6 is a schematic sectional view showing still another embodiment (multilayered structure) of the organic electroluminescent device of the present invention.

That is, as illustrated in FIG. 3, the organic EL device may be one composed of a substrate 10, an anode 11 formed thereon, a light-emitting layer 12, and a cathode 13 laminated on the anode in this order, or, as shown in FIG. 4, it may be one composed of a substrate 20, an anode 21 formed thereon, a hole-transporting layer 24, a light-emitting layer 22, and a cathode 23 laminated on the anode in this order. Further, as shown in FIG. 5, the organic EL device may be one composed of a substrate 30, an anode 31 formed thereon, a light-emitting layer 32, an electron-transporting layer 35, and a cathode 33 laminated on the anode in this order, or, as shown in FIG. 6, it may be one composed of a substrate 40, an anode 41 formed thereon, a hole-transporting layer 44, a light-emitting layer 42, an electron-transporting layer 45, and a cathode 43 laminated on the anode in this order.

The thickness of each of the layers constituting the organic EL device is not particularly limited, and is about 10 nm to 1 μm (e.g., about 10 to 500 nm), preferably about 30 to 300 nm, more preferably about 30 to 200 nm, particularly about 5 to 20 nm. When films are employed, the thickness of each film can be selected within the ranges mentioned above.

Exemplified as the substrate are those mentioned above, such as substrates having sufficient transparency to transmit laser beams (e.g., a glass plate, such as a soda glass, a no-alkali glass, and a quartz glass, a polymer sheet or film of a polyester, a polysulfone, and a polyethersulfone). For the fabrication of flexible organic EL devices, the use of polymer films are preferred. As the substrate, a substrate used on the molecular implantation may be employed without modification, or a substrate produced freshly may be employed.

According to the present invention, fine and multicolor patterning of an organic EL device made with macromolecular compounds which had long been difficult to realize was made possible. Further, since the material for the organic EL device (particularly, film for organic EL device) of the present invention is excellent in surface smoothness, it makes closely contact with the electrodes, and the organic EL device of the present invention is free from the irregularity in voltage caused upon application of voltage because of the emission center-forming compound implanted therein step-like.

INDUSTRIAL APPLICABILITY

The present invention ensure that high positioning is conducted by relatively moving a laser beam relative to at least a target, fine patterning is conducted simply, and the use of an optical fiber realizes high-precision fine patterning. Moreover, an efficient implantation of emission center-forming compound is realized by relatively moving a laser beam and at least a target with moving a source relative to the laser beam.

Moreover, according to the present invention, the utilization of high coherence (coherency) of a laser beam realizes a production of an emission center into an area corresponding to an interference pattern by an interference light of the laser beam. Since the interference pattern can be adjusted to a desired shape (form) and distance by selecting a parameter such as a hole diameter and a slit width suitably, fine patterning can be conducted simply.

EXAMPLES

The following examples are intended to describe this invention in further detail and should by no means be interpreted as defining the scope of the invention.

Example 1
(Preparation of Source Film)
A polybutylmethacrylate (manufactured by Aldrich Chemical Company, Inc., molecular weight: $3.4 \times 10^5$) containing 5% by weight of coumarin 6 (manufactured by Nippon Kankoh Shikiso, K.K.) was dissolved in chlorobenzene, and a layer having 1 μm thick was produced on a quartz substrate by a spin coating method.
(Preparation of Target Film)
500 mg of a poly-N-vinylcarbazol having a hole-transporting function (PVK: manufactured by Kanto Kagaku, K.K.) and 500 mg of 2-(4-biphenyl)-5-(4-tert-butylphenyl)-1,3,4-oxadiazole having an electron-transporting function (PBD: manufactured by Aldrich Chemical Company, Inc.) were dissolved in 10 ml of 1,2-dichloroethane. A coat layer of indium-tin-oxide (ITO) was formed on a glass substrate. Using the above-mentioned 1,2-dichloroethane solution, on the ITO coat layer thus obtained was formed a 100 nm thick target film having the electron and hole-transporting functions by dip coating.
(Molecular Implantation)
An emission center-forming compound was implanted into a pattern having an area of 20 $mm^2$ by bringing thus obtained source film into contact with thus obtained target film, fixing them on a table movable for X-axial and Y-axial directions with a target film surface turning up, using a laser processing apparatus capable of oscillating XeF excimer laser (wavelength: 351 nm) having 10 ns of a pulse width at 20 $mm^2$ of a beam area, and moving the table relative to the laser beam toward X-Y-axial direction.
(Organic EL Device)
A 200 nm thick Al/Li electrode (manufactured by Kohjundo Kagaku, K.K.; Li content: 0.78% by weight) was formed on the molecular-implanted target film (test piece 1) by vacuum deposition to provide an organic EL device 1.

With the ITO electrode of the above organic EL device as the anode and the Al/Li electrode layer as the cathode, a direct electric field was applied between the electrodes in the atmospheric air to cause the organic EL device to emit light. At a voltage of 18 V or so, emission of light was observed for the organic EL device 1. Emission of green light due to coumarin 6 was observed at the area into which coumarin 6 had been injected, and that of blue light due to PVK at the area other than the area of green light emission.

Example 2
(Preparation of Source Film)
A polybutylmethacrylate (manufactured by Aldrich Chemical Company, Inc., molecular weight: $3.4 \times 10^5$) containing 5% by weight of coumarin 6 (manufactured by Nippon Kankoh Shikiso, K.K.) was dissolved in chlorobenzene, and a layer having 2 μm thick was produced on a quartz substrate by a spin coating method.
(Preparation of Target Film)
A target film was produced in the same manner as in Example 1.
(Molecular Implantation)
A test piece, constituted of two films obtained above being in contact with each other, was fabricated, and, from the direction of the target substrate, the test piece was irradiated with third harmonic of YAG laser (wavelength: 355 nm, pulse width: 3 ns, irradiation energy per unit area: 20 mJ/$cm^2$, beam diameter: 1.8 mm) 10 times through a pinhole having a diameter of 1 mm.
(Organic EL Device)
A 200 nm thick Al/Li electrode layer (manufactured by Kohjundo Kagaku, K.K.; Li content: 0.78% by weight) was formed on the molecular-implanted target film by vacuum deposition to provide an organic EL device. With the ITO electrode of the above organic EL device as the anode and the Al/Li electrode layer as the cathode, a direct electric field was applied between the electrodes in the atmospheric air to cause the organic EL device to emit light. At a voltage of 18 V or so, emission of light was observed. An emission form (shape) reflected that of light interference generated on the occasion when YAG laser beam passed through the pinhole, and emission ring pattern being green concentrically was observed. In an area without molecular implantation, emission of blue due to PVK was observed, and in an area with molecular implantation, emission of green light due to coumarin 6 was observed.

What is claimed is:

1. A process for producing a material, for an organic electroluminescent device, having an emission center, which comprises implanting an emission center-forming compound constituting a source into a target by irradiating a laser beam, wherein said target has at least one function selected from the group consisting of an electron-transporting function and a hole-transporting function, and wherein
   (1) the laser beam and the target are moved relative to one another with irradiating the beam to form the emission center with a predetermined pattern, or
   (2) the emission center at an area of the target corresponding to an interference pattern of an interference light is formed by irradiating the interference light of the laser beam.

2. A process according to claim 1, wherein, in the method (1), the source and the target being in contact with each other are moved relative to the laser beam for forming the emission center with a predetermined pattern.

3. A process according to claim 1, wherein, in the method (1), the irradiation is conducted through a waveguide.

4. A process according to claim 1, wherein, in the method (1), the irradiation is conducted with the use of an optical fiber.

5. A process according to claim 1, wherein, in the method (1), the laser beam and the target are relatively moved with irradiating the beam and with moving the source relative to the beam for forming the emission center.

6. A process according to claim 1, wherein, in the method (2), a laser beam from a single light source is split into a plurality of light paths to cause the interference by an optical path difference.

7. A process according to claim 6, wherein the interference is caused by introducing the laser beam into a hole or a slit.

8. A process according to claim 6, wherein the interference is caused by reflecting the laser beam through a plurality of reflection paths.

9. A process according to claim 1, which comprises irradiating the laser beam with an intensity of or below the ablation threshold value of the source.

10. A process according to claim 1, wherein the laser beam comprises a pulse laser beam.

11. A process according to claim 10, wherein, in the method (1), the laser beam and the target are relatively moved with synchronizing the beam with a cycle of the pulse.

12. A process according to claim 1, wherein the target comprises an organic polymer.

13. A process according to claim 1, wherein the target comprises a compound having at least one function selected from the group consisting of the electron-transporting function and the hole-transporting function, and a film-formable organic polymer.

14. A process according to claim 13, wherein the compound comprises at least one compound selected from the group consisting of an oxadiazole derivative having the electron-transporting function, and an aromatic tertiary amine having the hole-transporting function.

15. A material for an organic electroluminescent device, which is obtainable by a process recited in claim 1.

16. An organic electroluminescent device which comprises a pair of electrodes, and a material recited in claim 15 which is interposed between the electrodes.

17. A material for an organic electro-luminescent device, which is obtainable by a process recited in claim 12.

18. An organic electroluminescent device which comprises a pair of electrodes, wherein a single layer formed with a material recited in claim 17 is interposed between the pair of electrodes.

* * * * *